(12) United States Patent
Rha et al.

(10) Patent No.: US 7,063,988 B1
(45) Date of Patent: Jun. 20, 2006

(54) CIRCUIT FOR DETECTING ARCING IN AN ETCH TOOL DURING WAFER PROCESSING

(75) Inventors: John Rha, La Palma, CA (US); Glenn W. Adams, Costa Mesa, CA (US)

(73) Assignee: Newport Fab, LLC, Newport Beach, CA (US)

( * ) Notice: Subject to any disclaimer, the term of this patent is extended or adjusted under 35 U.S.C. 154(b) by 101 days.

(21) Appl. No.: 10/758,494

(22) Filed: Jan. 15, 2004

(51) Int. Cl.
*H01L 21/00* (2006.01)

(52) U.S. Cl. .......................... 438/5; 205/791.5
(58) Field of Classification Search ............ 438/5; 205/795.1
See application file for complete search history.

(56) References Cited

U.S. PATENT DOCUMENTS

| | | | | |
|---|---|---|---|---|
| 5,175,472 | A * | 12/1992 | Johnson et al. | 315/111.21 |
| 6,144,245 | A * | 11/2000 | Balogh | 327/380 |
| 2003/0122605 | A1 * | 7/2003 | Ulrick et al. | 327/309 |
| 2004/0031699 | A1 * | 2/2004 | Shoji | 205/791.5 |

OTHER PUBLICATIONS

Terry Barrette et al., "Evaluation of Early Failure Screening Mehtod"s, IEEE, 1996, pp. 14-17.*
C. L. Henderson et al., "ICFAX, An Integrated Circuit Failure Analysis Expert System",IEEE,IRPS, 1991, pp. 142-151.*

* cited by examiner

*Primary Examiner*—W. David Coleman
(74) *Attorney, Agent, or Firm*—Farjami & Farjami LLP

(57) ABSTRACT

According to one exemplary embodiment, a circuit configured to interface with an etch tool comprises an ESC input for receiving a first signal from the etch tool, where the first signal indicates a magnitude of a chuck current passing through a chuck holding a wafer in the etch tool. The circuit further comprises a VRF input for receiving a second signal from the etch tool, which indicates a magnitude of a voltage difference between a plasma and the chuck in the etch tool. The circuit further comprises an arc detect output indicating whether an arc event has occurred. The circuit can be configured to prevent the arc detect output from indicating an occurrence of a chucking spike and a de-chucking spike in the etch tool.

19 Claims, 3 Drawing Sheets

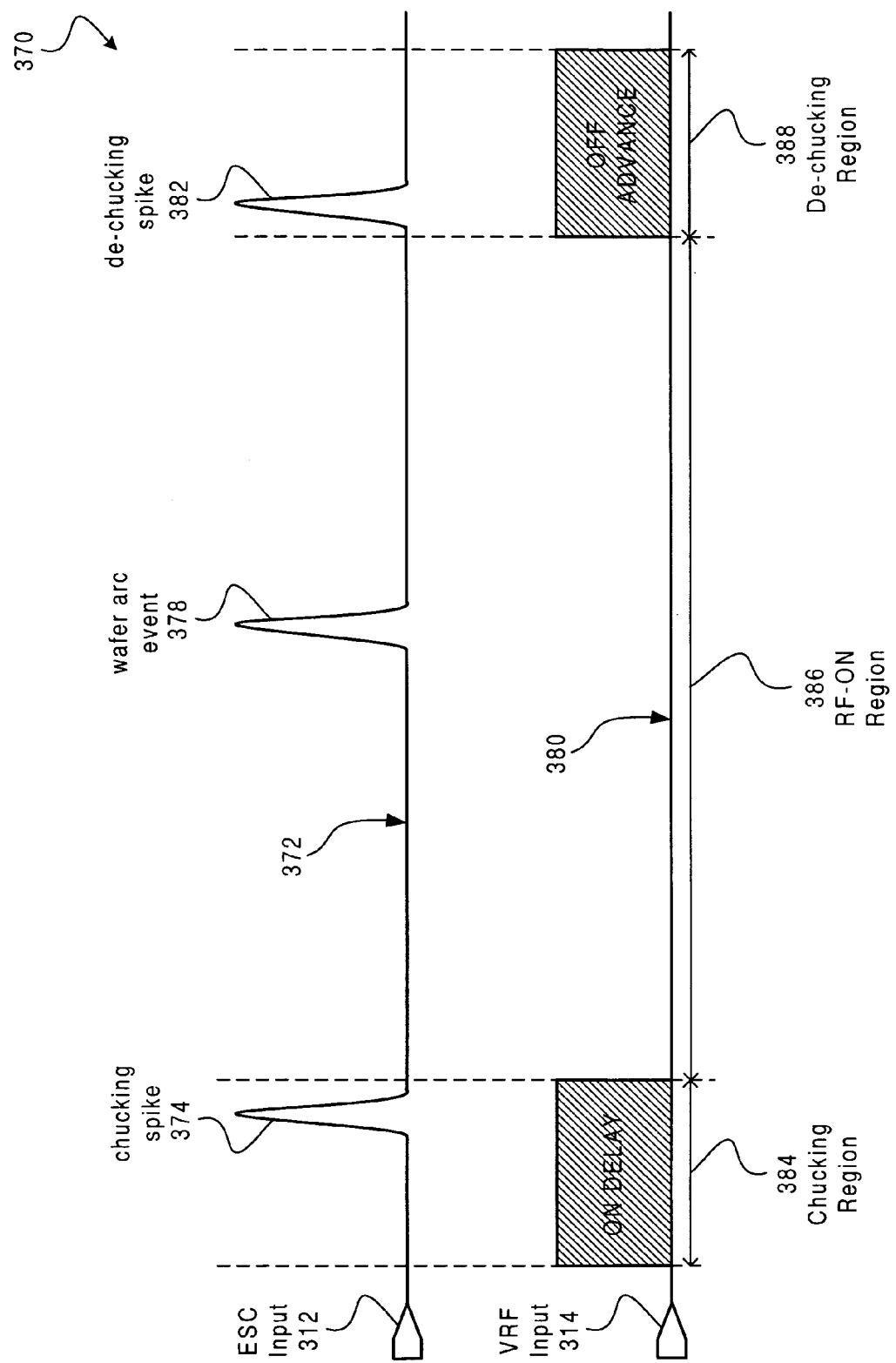

CIRCUIT FOR DETECTING ARCING IN AN ETCH TOOL DURING WAFER PROCESSING

BACKGROUND OF THE INVENTION

1. Field of the Invention

The present invention is generally directed to the field of semiconductor fabrication. More particularly, the present invention is in the field of plasma etch tools for semiconductor fabrication.

2. Related Art

Plasma etch tools have a tendency to generate electric arcs during long high bias processes. Arcing is caused by a higher than desired charge building up on the chuck upon which the wafer is mounted during processing. When the charge built up on the chuck reaches a critical voltage potential difference from the etch tool plasma, an electric arc is generated from the plasma through the wafer to the chuck to dissipate this voltage potential difference. Arcing during plasma processing requires the processed wafer to be scrapped. Further processing of wafers that need to be scrapped wastes time and resources. Also, allowing wafer processing to continue during arcing will cause additional wafers to be scrapped, which lowers the useful yield of the fabrication process and undesirably increases manufacturing costs.

Makers of plasma etch tools have focused on reducing the number of arcing incidents, but these solutions have not resulted in elimination of arcing events, and arced wafers continue to be discovered too late, after completion of an entire time-consuming wafer processing run. A real-time data acquisition tool was developed so that semiconductor fabrication personnel could detect wafer arcing by monitoring the conditions that affect arcing. However, real-time data monitoring requires that a person be present and alert to monitor the etch tool during the entire wafer processing, which can last several hours. Thus, the human-monitor approach is costly and subject to human error. Another approach similar to the human-monitor approach utilizes a computer system to oversee the monitoring and control process instead of a person. However, this approach is costly since it must be customized for each application and requires a computer system.

Thus, there is a need in the art for a cost-effective device that can accurately detect arcing in an etch tool during wafer processing.

SUMMARY OF THE INVENTION

The present invention is directed to circuit for detecting arcing in an etch tool during wafer processing. The present invention addresses and resolves the need in the art for a cost-effective device that can accurately detect arcing in an etch tool during wafer processing.

According to one exemplary embodiment, a circuit configured to interface with an etch tool comprises an ESC input for receiving a first signal from the etch tool, where the first signal indicates a magnitude of a chuck current passing through a chuck holding a wafer in the etch tool. For example, the first signal can indicate an occurrence of a chucking spike, a de-chucking spike, or an arc event in the etch tool. The circuit further comprises a VRF input for receiving a second signal from the etch tool, where the second signal indicates a magnitude of a voltage difference between a plasma and the chuck in the etch tool.

According to this exemplary embodiment, the circuit further comprises an arc detect output indicating whether an arc event has occurred. The circuit can be configured to prevent the arc detect output from indicating an occurrence of a chucking spike and a de-chucking spike in the etch tool. The circuit can further comprise an ESC signal level detector connected to the ESC input, where the ESC signal level detector is configured to provide an output when the first signal indicates the occurrence of the chucking spike, the de-chucking spike, or the arc event. The circuit can further comprise a VRF signal level detector connected to the VRF input, where the VRF signal level detector is configured to provide an output when the second signal indicates that the plasma is activated.

According to this exemplary embodiment, the circuit can further comprise a first gate having a first gate input, a second gate input, and a first gate output, where the first gate input is connected to the ESC input and the second gate input is connected to the VRF input, and where the first gate is configured to output a third signal at the first gate output when the first signal indicates the occurrence of the de-chucking spike and the arc event and not output the third signal at the first gate output when the first signal indicates the occurrence of the chucking spike. The circuit can further comprise a power-on delay connected between the VRF input and the second gate input, where the power-on delay is configured to prevent the first gate from outputting the third signal during the occurrence of the chucking spike.

The circuit can further comprise a second gate having a third gate input, a fourth gate input, and a second gate output, where the third gate input is connected to the first gate output and the fourth gate input is connected to the VRF input, and where the second gate is configured to output a fourth signal at the second gate output during the occurrence of the arc event and not output the fourth signal during the occurrence of the de-chucking spike. Other features and advantages of the present invention will become more readily apparent to those of ordinary skill in the art after reviewing the following detailed description and accompanying drawings.

BRIEF DESCRIPTION OF THE DRAWINGS

FIG. 3 illustrates an exemplary timing diagram in accordance with one embodiment of the present invention.

DETAILED DESCRIPTION OF THE INVENTION

The present invention is directed to circuit for detecting arcing in an etch tool during wafer processing. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
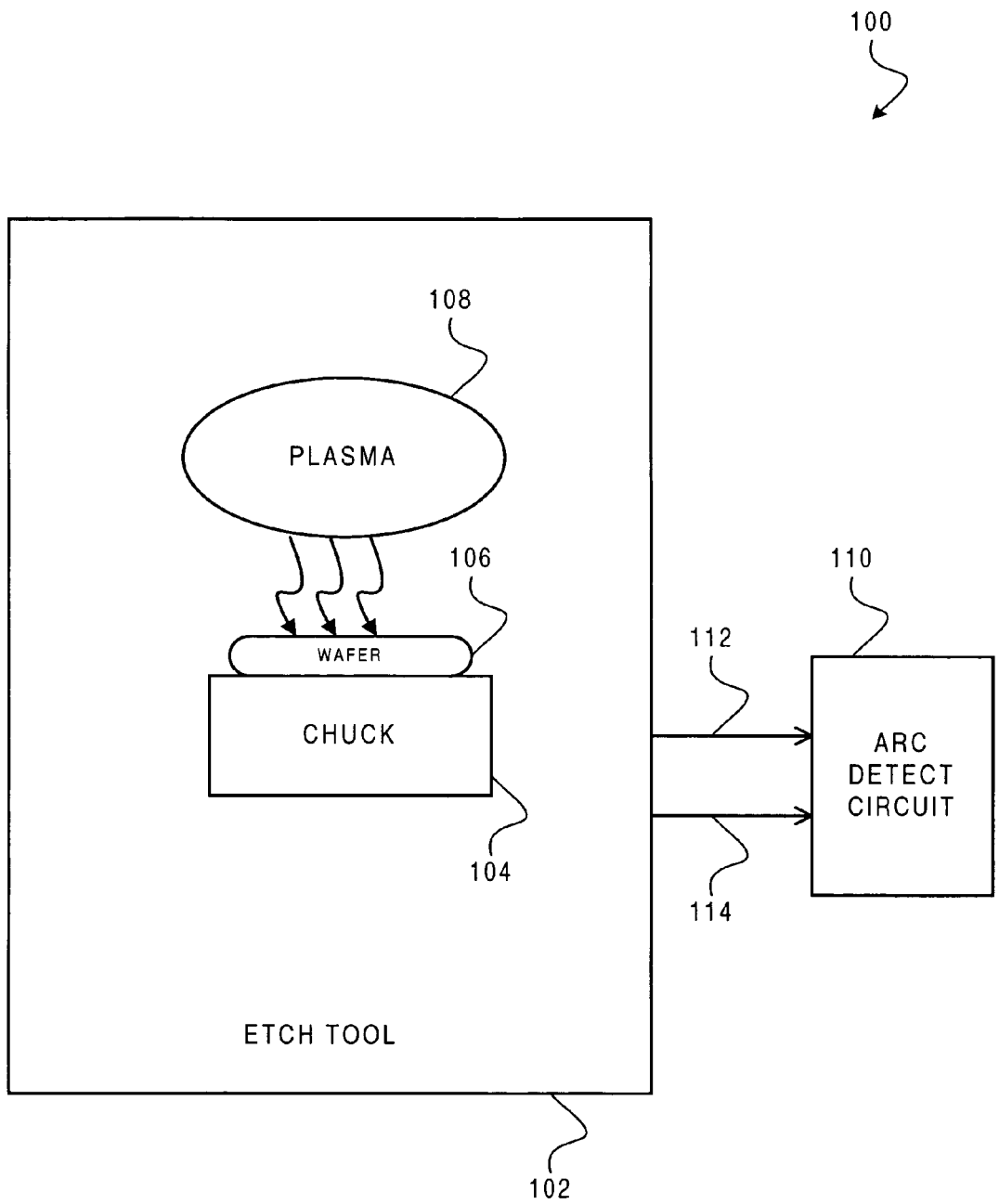
FIG. 1 is a block diagram of an exemplary arc detection circuit coupled to an exemplary etch tool in accordance with one embodiment of the present invention.

FIG. 1 shows a diagram of an exemplary etch tool coupled to an exemplary arc detect circuit in accordance with one embodiment of the present invention. Certain details and features have been left out of FIG. 1, which are apparent to a person of ordinary skill in the art. Diagram 100 in FIG. 1 includes etch tool 102 coupled to arc detect circuit 110. As shown in FIG. 1, etch tool 102 includes chuck 104, wafer 106, and plasma 108. Etch tool 102 can be, for example, a plasma etch tool such as the Centura eMAX™ oxide etch tool manufactured by Applied Materials, Inc.

As further shown in FIG. 1, chuck 104 is situated in etch tool 102 and can be an electrostatic chuck (ESC). Also shown in FIG. 1, wafer 106 is situated on chuck 104. Wafer 106 can be secured to chuck 104 by an electrostatic force during a wafer processing procedure. Further shown in FIG. 1, plasma 108 is situated inside etch tool 102 and can be utilized to etch wafer 106. Plasma 108 can be formed, for example, by ionizing a process gas in an electric field by utilizing an RF power source (not shown in FIG. 1). Also shown in FIG. 1, arc detect circuit 110 is connected to etch tool 102 by lines 112 and 114. Arc detect circuit 110 can receive an ESC signal via line 112 (or "ESC input 112") and a VRF signal via line 114 (or "VRF input 114"), and can be configured to provide a specified output if wafer arcing occurs while arc detect circuit 110 is in an armed condition.

Before wafer processing, a chucking procedure is used to mount wafer 106 on chuck 104, and after wafer processing, a de-chucking procedure is used to remove wafer 106 from chuck 104. Chucking and de-chucking procedures cause spikes in the chuck current signal that resemble spikes caused by wafer arcing. In the present invention, arc detect circuit 110 can be configured to ignore spikes that occur during chucking and de-chucking procedures, and to provide a specified output only when a verified wafer arc event occurs. The present invention's arc detect circuit will be described in greater detail in relation to FIG. 2.

Figure 2:
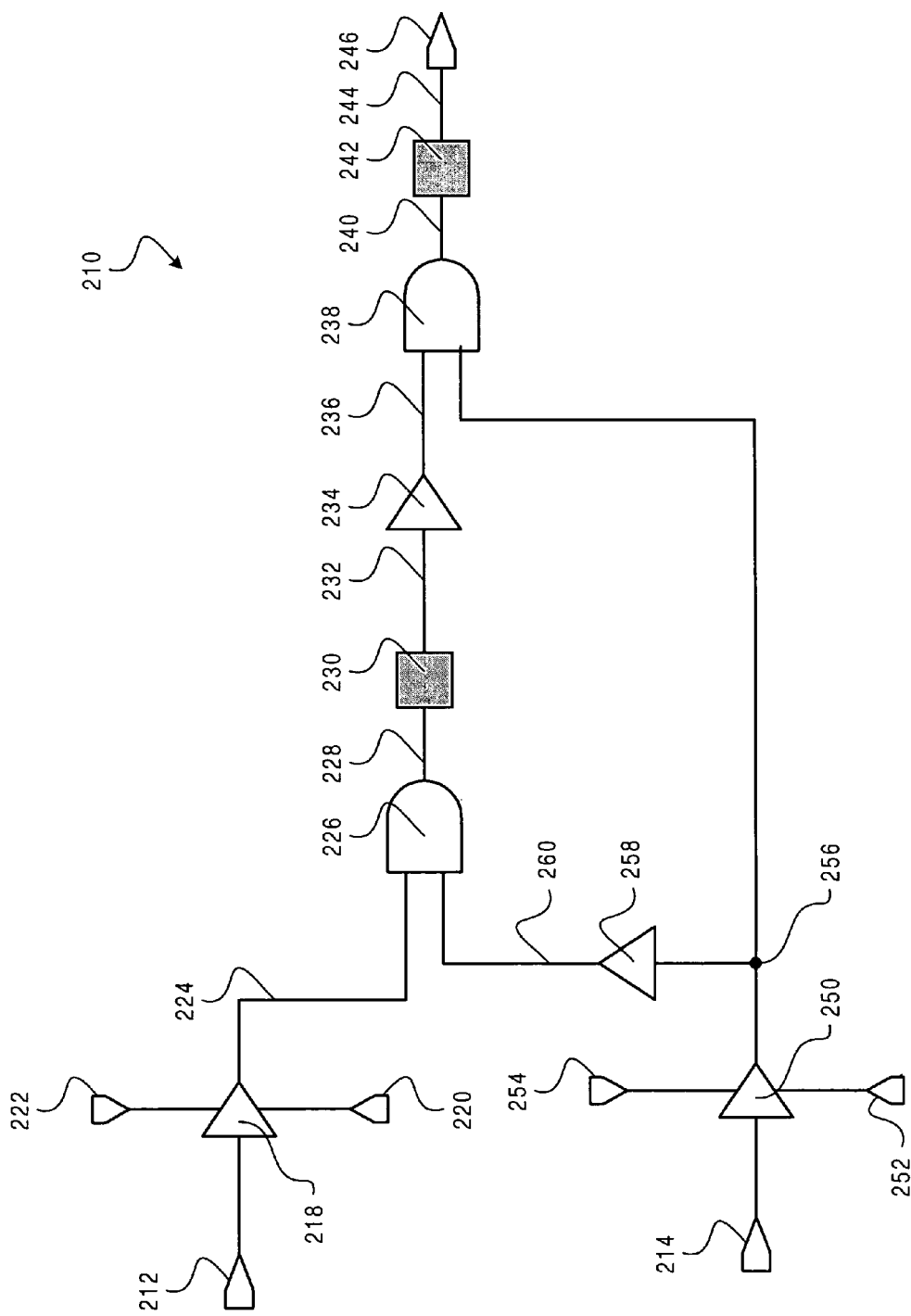
FIG. 2 illustrates a diagram of an exemplary arc detection circuit in accordance with one embodiment of the present invention.

FIG. 2 shows a block diagram of an exemplary arc detect circuit, in accordance with one embodiment of the present invention. Certain details and features have been left out of FIG. 2, which are apparent to a person of ordinary skill in the art. Arc detect circuit 210 includes ESC input 212, VRF input 214, ESC signal level detector 218, VRF signal level detector 250, delay module 258, AND gate 226, storage module 230, delay module 234, AND gate 238, storage module 242, and arc detect output 246. Arc detect circuit 210 in FIG. 2 corresponds to arc detect circuit 110 in FIG. 1, and ESC input 212 corresponds to ESC input 112 while VRF input 214 corresponds to VRF input 114 of arc detect circuit 110 in FIG. 1.

As shown in FIG. 2, ESC input 212 is connected to a signal input of ESC signal level detector 218. ESC input 212 can receive an indication of a current flowing through a chuck ("chuck current") situated in an etch tool, such as chuck 104 in etch tool 102 in FIG. 1. As further shown in FIG. 2, low voltage-setting means 220 is connected to a low range input of ESC signal level detector 218 and high voltage-setting means 222 is connected to a high range input of ESC signal level detector 218. By way of example, each low voltage-setting means 220 and high voltage-setting means 222 can be set to a voltage chosen between −5V and +5V. For example, low voltage-setting means 220 can provide a lower limit of approximately −0.5V while high voltage-setting means 222 can provide an upper limit of approximately +0.3V.

ESC signal level detector 218 can be configured to output a signal when an arc event is detected at the signal input of ESC signal level detector 218. For example, when an ESC signal at ESC input 212 is outside the range of −0.5V to +0.3V, ESC signal level detector 218 can be configured to output a signal that indicates that a wafer arc event, a chucking spike, or a de-chucking spike, has been indicated at the signal input of ESC signal level detector 218. However, signal level detector 218 does not distinguish between a wafer arc event and chucking and de-chucking spikes at ESC input 212.

The output of ESC signal level detector 218 is connected to a first input of gate 226 via line 224. Gate 226 can be a 2-to-1 logical AND-gate, and can be configured to provide an output signal, such as a logical one, at an output of gate 226 that indicates only an occurrence of an arc event or a de-chucking spike at ESC input 212. Thus, the signal outputted at the output of gate 226 does not indicate an occurrence of a chucking spike at ESC input 212. The output of gate 226 is connected to an input of storage module 230 via line 228. Storage module 230 can be, for example, a latch, and can be configured to store the output signal received from gate 226 indicating the occurrence of a de-chucking spike or an arc event. The output of storage module 230 is connected to an input of power-off advance module 234 via line 232. Power-off advance module 234 can be set to delay an output signal received from storage module 230 by, for example, from 0 to 8 seconds. In the present embodiment, power-off advance module 234 can be set to delay the output signal received from storage module 230 by approximately 8 seconds.

The output of power-off advance module 234 is connected to a first input of gate 238 via line 236. Gate 238 can be, for example, a 2-to-1 AND-gate, and can be configured to provide an output signal, such as a logical one, at an output of gate 238 that indicates an occurrence of an arc event and does not indicate an occurrence of a de-chucking spike. The output of gate 238 is connected to an input of storage module 242 via line 240. Storage module 242 can be, for example, a latch, and can be configured to store a signal received from the output of gate 238, which indicates an occurrence of an arc event. An output of storage module 242 is connected to arc detect output 246. Thus, the signal stored in storage module 242, which indicates an occurrence of an arc event, can be provided at arc detect output 246.

Also shown in FIG. 2, VRF input 214 is connected to an input of VRF signal level detector 250. VRF input 214 can receive a VRF signal such as a plasma RF voltage from line 114 in FIG. 1. As shown in FIG. 2, low voltage-setting means 252 is connected to a low range input of VRF signal level detector 250 and high voltage-setting means 254 is connected to a high range input of VRF signal level detector 250. Low voltage-setting means 252 and high voltage-setting means 254 can be set, for example, from −5V to +5V. Low voltage-setting means 252 can provide a lower limit of approximately −0.5V and high voltage-setting means 254 can provide an upper limit of approximately +5.0V, for example. VRF signal level detector 250 can be configured to output a signal, such as a logical one, when plasma 108 in etch tool 102 in FIG. 1 has been activated. For example, when a VRF signal at VRF input 214 is less than approximately −0.5V, VRF signal level detector 250 can be configured to output a signal, such as a logical one, to indicate that plasma, such as plasma 108 in FIG. 1, has been activated.

Plasma, such as plasma 108 in etch tool 102 in FIG. 1, can be in an activated state when the VRF signal at VRF input 214 is less than a threshold voltage of approximately −0.5V. In one embodiment, the VRF signal at VRF input 214 can be in a range of approximately −1V to −2V when plasma 108 is activated. The VRF signal at VRF input 214 can be obtained, for example, by tapping a line from an RF generator (not shown in any of the figures) that powers plasma 108 in etch tool 102. The RF generator (not shown in any of the figures) can generate from 300 watts to 2000 watts of power, for example. In one embodiment, the VRF signal at VRF input 214 can be inversely proportional to the power supplied by the RF generator (not shown in any of the figures).

Also shown in FIG. 2, the output of VRF signal level detector 250 is connected to an input of power-on delay module 258 and to a second input of gate 238 at node 256. Power-on delay module 258 can be set to delay a signal provided at the output of VRF signal level detector 250 by, for example, from 0 to 8 seconds. In the present embodiment, power-on delay module 258 can be set to delay the output of VRF signal level detector 250 by approximately 2 seconds. The output of power-on delay module 258 is connected to a second input of gate 226 via line 260. Power-on delay module 258 can be configured to prevent the output signal received from the output of VRF signal level detector 250 from reaching the second input of gate 226 during a wafer chucking procedure.

FIG. 3 shows a timing diagram of an ESC signal and a VRF signal during typical wafer processing, in accordance with one embodiment of the present invention. Certain details and features have been left out of FIG. 3, which are apparent to a person of ordinary skill in the art. In timing diagram 370 in FIG. 3, ESC input 312 and VRF input 314 correspond respectively to ESC input 212 and VRF input 214 in FIG. 2. Timing diagram 370 includes ESC input 312, VRF input 314, chuck current 372, chucking spike 374, de-chucking spike 382, wafer arc event 378, VRF signal 380, chucking region 384, RF-ON region 386, and de-chucking region 388.

As shown in FIG. 3, chuck current 372, which is inputted into an arc detect circuit, such as arc detect circuit 210 in FIG. 2, at ESC input 312, includes chucking spike 374, de-chucking spike 382, and wafer arc event 378. Chucking spike 374 can occur during a wafer chucking procedure and de-chucking spike 382 can occur during a de-chucking procedure in an etch tool, such as etch tool 102 in FIG. 1. Wafer arc event 378 can occur when an electric arc flows through a wafer, such as wafer 106, which is situated between a plasma, such as plasma 108, and a chuck, such as chuck 104. Chuck current 372 can be between approximately 1.0 microamperes and 2.0 microamperes when chucking spike 374, de-chucking spike 382, or wafer arc event 378 are not occurring. During an occurrence of chucking spike 374, de-chucking spike 382, or wafer arc event 378, chuck current 372 can be between approximately −150 microamperes and +100 microamperes.

Also shown in FIG. 3, VRF signal 380, which can be inputted into an arc detect circuit, such as arc detect circuit 210, at VRF input 314, can have a voltage less than approximately −0.5V in RF-ON region 386, which indicates that a plasma, such as plasma 108 in FIG. 1, is activated. In chucking region 384 and de-chucking region 388, VRF signal 380 can have an appropriate voltage that is greater than approximately −0.5V, which indicates that a plasma, such as plasma 108 in etch tool 102, is not active.

Thus, in RF-ON region 386, the arc detect circuit, such as arc detect circuit 210, is armed and configured to detect the occurrence of wafer arc event 378. However, in chucking region 384 and de-chucking region 388, plasma is not active and, therefore, no wafer arc event can occur. Thus the arc detect circuit, such as arc detect circuit 210, can be configured to ignore chucking spike 374, which occurs in chucking region 384, and de-chucking spike 382, which occurs in de-chucking region 388, since chucking spike 374 and de-chucking spike 382 do not indicate a wafer arc event.

The operation of the present invention's arc detect circuit will now be discussed in relation to FIGS. 1 and 2. ESC signal level detection can be accomplished by the use of two comparators in ESC signal level detector 218. The current flowing through chuck 104 can be converted to voltage at ESC input 212 through a standard means, since the comparators in ESC signal level detector 218 compare an input voltage to high and low threshold voltages. A low-comparator in ESC signal level detector 218 compares the ESC signal from ESC input 212 to the low threshold voltage of ESC signal level detector 218. If ESC signal at ESC input 212 is below the low threshold voltage, the low-comparator outputs a logical one. If the ESC signal is not lower than the low-threshold voltage, then a high-comparator compares ESC signal to the high threshold voltage and outputs a logical one if ESC signal is higher than the high threshold voltage. If either comparator outputs a logical one, then ESC signal level detector 218 outputs a logical one, indicating that the ESC signal at ESC input 212 is above or below the acceptable range for the ESC signal. When the ESC signal falls within the desired high and low threshold range, ESC signal level detector 218 outputs a logical zero.

VRF signal level detector 250 can also utilize a comparator to make a comparison of a VRF signal at VRF input 214 to a desired threshold, for example, −0.5V, and output a logical one if the VRF signal at VRF input 214 is below the threshold, or output a logical zero if VRF signal is above the threshold. Initially plasma 108 has not been activated, and no current is flowing through chuck 104. Then, RF voltage is applied to plasma 108, and chuck 104 is charged during a wafer chucking procedure. During normal wafer processing, chuck current can be between approximately 1.0 microamperes and 2.0 microamperes. During an occurrence of chucking spike, a de-chucking spike, or a wafer arc event, chuck current, as measured at ESC input 212, can vary from −150 microamperes to +100 microamperes. The chuck current during normal wafer processing, i.e. when a chucking spike, a de-chucking spike, or a wafer arc event is not occurring, translates to a voltage of approximately −0.5V to +0.3V at ESC input 212. Thus, a chucking spike will cause the ESC signal at ESC input 212 to be greater than +0.3V or less than −0.5V. ESC signal level detector 218 can detect a chucking spike at ESC input 212. However, power-on delay module 258 prevents VRF signal level detector 250 from sending a logical one to gate 226 for the approximate two seconds required for a chucking procedure, and thus the signal provided at the output of gate 226 will not indicate an occurrence of a chucking spike.

After chucking, the chuck current measured at ESC input 212 returns to a normal non-spiking current in the 1.0 to 2.0 microampere range. If no arc event occurs, both ESC signal level detector 218 and VRF signal level detector 250 will transmit logical ones to gate 226 during an occurrence of a de-chucking spike. Thus, gate 226 will latch storage module 230 during a de-chucking spike. However, during de-chucking, power-off advance module 234 will delay the signal from the signal stored in storage module 230 until such time as plasma 108 has been deactivated and VRF signal level detector 250 no longer detects a signal less than −0.5V at VRF input 214. As discussed above, power-off advance for de-chucking can be approximately eight seconds, after which gate 238 no longer receives a logical one from VRF signal level detector 250, and thus is unable to latch storage module 242 during an occurrence of a de-chucking spike.

If a wafer arc event occurs while arc detect circuit 210 is armed, gate 226 will latch storage module 230, and after an approximate eight second delay, gate 238 will latch storage module 242. As a result, a logical one will be stored at storage module 242, which indicates that a wafer arc event has occurred during wafer processing. The signal stored at storage module 242, i.e. the logical one indicating the occurrence of the wafer arc event, can be recalled at a later time at arc detect output 246.

Thus, the present invention advantageously achieves an arc detect circuit that can accurately detect arc events in an etch tool while preventing detection of chucking and de-chucking spikes that can occur during respective chucking and de-chucking procedures in the etch tool. Additionally, the present invention advantageously achieves a cost-effective circuit for detecting wafer arcing in an etch tool while not requiring human or computer system monitoring.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, circuit for detecting arcing in an etch tool during wafer processing has been described.

The invention claimed is:

1. A circuit configured to interface with an etch tool, said circuit comprising:
   an ESC input for receiving a first signal from said etch tool, said first signal indicating a magnitude of a chuck current passing through a chuck holding a wafer in said etch tool;
   a VRF input for receiving a second signal from said etch tool, said second signal indicating a magnitude of a voltage difference between a plasma and said chuck in said etch tool;
   an arc detect output indicating whether an arc event has occurred wherein said arc detect output does not indicate an occurrence of a chucking spike and a de-chucking spike in said etch tool.

2. The circuit of claim 1 wherein said first signal indicates an occurrence of the group consisting of a chucking spike, a de-chucking spike, and said arc event in said etch tool.

3. The circuit of claim 1 further comprising an ESC signal level detector connected to said ESC input, said ESC signal level detector being configured to provide an output when said first signal indicates an occurrence of the group consisting of a chucking spike, a de-chucking spike, and said arc event.

4. The circuit of claim 1 further comprising a VRF signal level detector connected to said VRF input, said VRF signal level detector being configured to provide an output when said second signal indicates that said plasma is activated.

5. The circuit of claim 1 further comprising a first gate having a first gate input, a second gate input, and a first gate output, said first gate input being connected to said ESC input and said second gate input being connected to said VRF input, said first gate being configured to output a third signal at said first gate output when said first signal indicates an occurrence of a de-chucking spike and said arc event and not output said third signal at said first gate output when said first signal indicates an occurrence of a chucking spike.

6. The circuit of claim 5 further comprising a power-on delay connected between said VRF input and said second gate input, said power-on delay being configured to prevent said first gate from outputting said third signal during said occurrence of said chucking spike.

7. The circuit of claim 5 further comprising a second gate having a third gate input, a fourth gate input, and a second gate output, said third gate input being connected to said first gate output and said fourth gate input being connected to said VRF input, said second gate being configured to output a fourth signal at said second gate output during said occurrence of said arc event and not output said fourth signal at said second gate output during said occurrence of said de-chucking spike.

8. The circuit of claim 1 further comprising a storage module having an input and an output, said output of said storage module being connected to said arc detect output, said storage module being configured to store a third signal received at said input of said storage module and output said third signal at said output of said storage module, said third signal indicating an occurrence of said arc event.

9. The circuit of claim 5 further comprising a power-off advance connected to said first gate output, said power-off advance being configured to prevent said arc detect output from indicating said occurrence of said de-chucking spike.

10. A circuit configured to interface with an etch tool, said circuit comprising:
    an ESC input for receiving a first signal from said etch tool, said first signal indicating a magnitude of a chuck current passing through a chuck holding a wafer in said etch tool;
    a VRF input for receiving a second signal from said etch tool, said second signal indicating a magnitude of a voltage difference between a plasma and said chuck in said etch tool;
    an arc detect output indicating whether an arc event has occurred;
    wherein said circuit is configured to prevent said arc detect output from indicating an occurrence of a chucking spike and a de-chucking spike in said etch tool.

11. The circuit of claim 10 wherein said first signal indicates an occurrence of the group consisting of said chucking spike, said de-chucking spike, and said arc event in said etch tool.

12. The circuit of claim 10 further comprising an ESC signal level detector connected to said ESC input, said ESC signal level detector being configured to output a third signal when said first signal indicates an occurrence of the group consisting of said chucking spike, said de-chucking spike, and said arc event.

13. The circuit of claim 12 further comprising a gate having a first gate input, a second gate input, and a gate output, said first gate input being connected to said ESC signal level detector and said second gate input being connected to said VRF input, said gate being configured to output a fourth signal at said gate output when said third signal indicates an occurrence of said de-chucking spike and said arc event and not output said fourth signal when said third signal indicates an occurrence of said chucking spike.

14. The circuit of claim 10 further comprising a VRF signal level detector connected to said VRF input, said VRF signal level detector being configured to output a third signal when said second signal indicates that said plasma is activated.

15. The circuit of claim 14 further comprising a gate having a first gate input, a second gate input, and a gate output, said first gate input being connected to said ESC input and said second gate input receiving said third signal, said gate being configured to output a fourth signal at said gate output when said first signal indicates an occurrence of said de-chucking spike and said arc event and not output said fourth signal when said first signal indicates an occurrence of said chucking spike.

16. The circuit of claim 10 further comprising a first gate having a first gate input, a second gate input, and a first gate output, said first gate input being connected to said ESC input and said second gate input being connected to said VRF input, said first gate being configured to output a third signal at said first gate output when said first signal indicates an occurrence of said de-chucking spike and said arc event and not output said third signal at said first gate output when said first signal indicates an occurrence of said chucking spike.

17. The circuit of claim 16 further comprising a power-on delay coupled between said VRF input and said second gate input, said power-on delay being configured to prevent said first gate from outputting said third signal at said first gate output during said occurrence of said chucking spike.

18. The circuit of claim 16 further comprising a second gate having a third gate input, a fourth gate input, and a second gate output, said third gate input being connected to said first gate output and said fourth gate input being connected to said VRF input, said second gate being configured to receive said third signal outputted by said first gate and output a fourth signal at said second gate output during said occurrence of said arc event and not output said fourth signal at said second gate output during said occurrence of said de-chucking spike.

19. The circuit of claim 16 further comprising a power-off advance connected to said first gate output, said power-off advance being configured to prevent said arc detect output from indicating said occurrence of said de-chucking spike.

\* \* \* \* \*